(12) United States Patent
Heinz

(10) Patent No.: US 6,700,308 B2
(45) Date of Patent: Mar. 2, 2004

(54) PIEZOELECTRIC ACTUATOR

(75) Inventor: Rudolf Heinz, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/175,840

(22) Filed: Jun. 21, 2002

(65) Prior Publication Data
US 2002/0163282 A1 Nov. 7, 2002

Related U.S. Application Data

(63) Continuation of application No. 09/701,506, filed as application No. PCT/DE00/00533 on Feb. 25, 2000, now abandoned.

(30) Foreign Application Priority Data

Mar. 30, 1999 (DE) .......................... 199 14 411

(51) Int. Cl.⁷ .............................................. H01L 41/08
(52) U.S. Cl. ........................................ 310/328; 310/340
(58) Field of Search .......................... 310/333, 323.01, 310/325, 340, 328

(56) References Cited

U.S. PATENT DOCUMENTS

| | | | | |
|---|---|---|---|---|
| 3,396,285 A | * | 8/1968 | Minchenko | 310/325 |
| 5,148,077 A | * | 9/1992 | Grawey et al. | 310/328 |
| 5,271,133 A | * | 12/1993 | Dam et al. | 310/328 X |
| 5,389,851 A | * | 2/1995 | Kimura et al. | 310/340 |
| 5,545,942 A | * | 8/1996 | Jaster et al. | 310/340 X |
| 5,550,790 A | * | 8/1996 | Velamoor et al. | 310/340 X |
| 5,986,386 A | * | 11/1999 | Jaenker | 310/340 |
| 5,987,992 A | * | 11/1999 | Watanabe et al. | 310/346 X |
| 6,333,587 B1 | * | 12/2001 | Heinz et al. | 310/328 |

* cited by examiner

*Primary Examiner*—Mark Budd
(74) *Attorney, Agent, or Firm*—Ronald E. Greigg

(57) ABSTRACT

The invention relates to a piezoelectric actuator, in particular for actuating control valves or injection valves in motor vehicles, having an actuator body in the form of a multi-layered laminate made up of stacked layers of piezoelectric material with intervening metallic or electrically conductive layers that function as electrodes, and the end faces of this actuator body are respectively contacted by a top plate oriented toward the valve having an axially protruding valve tappet and a bottom plate at the opposite end, wherein the actuator rests in an axial bore of a valve housing and is prestressed at the ends in the axial direction between the top plate and the bottom plate by means of a spring element. According to the invention, the actuator—at least including the top plate—is enclosed by an electrically insulating elastomer sleeve so that when installed, the actuator with the elastomer sleeve rests snugly against the inner wall of the axial bore of the valve housing in the vicinity of the actuator.

8 Claims, 2 Drawing Sheets

PIEZOELECTRIC ACTUATOR

CROSS REFERENCE TO RELATED APPLICATIONS

This is a continuation of application Ser. No. 09/701,506, having a 35 USC 102(e) date of Mar. 16, 2001 Now Abandoned, which was a 35 USC 371 application of PCT/DE 00/00533 filed on Feb. 25, 2000.

PRIOR ART

The invention relates to a piezoelectric actuator, in particular for actuating control valves or injection valves in motor vehicles, having an actuator body in the form of a multilayered laminate made up of stacked layers of piezoelectric material with intervening metallic or electrically conductive layers that function as electrodes, and the end faces of this actuator body are respectively contacted by a top plate oriented toward the valve having an axially protruding valve tappet and a bottom plate at the opposite end, wherein the actuator rests in an axial bore of a valve housing and is prestressed at the ends in the axial direction between the top plate and the bottom plate by means of a spring element.

A piezoelectric actuator of this kind has been disclosed, for example, by DE 196 50 900 A1 from Robert Bosch GmbH.

If a pulsating electrical voltage is applied to their electrode layers, multilayered piezoelectric actuators of this kind execute analogously pulsating strokes by changing the distance between their two end faces. The multilayered piezoelectric actuator is operated with voltages that produce high field intensities. Field intensities of 2 kV/mm to 3 kV/mm are customary. The operating voltage lies between 100 V and 250 V. The multilayered piezoelectric actuator must be supported in the steel housing of the injection valve in such a way that no short-circuits occur. A centered installation with a definite distance to the outer wall is consequently required so that there is no danger of short-circuits between the actuator body and the outer wall.

During operation of multilayered piezoelectric actuators of this kind, heat is produced in the actuator body which must be dissipated outward, i.e. to the valve housing of the injection or control valve, for example, in order to prevent damage to the piezoelectric actuator and impairment of its function.

In the above-mentioned DE 196 50 900 A1, in order to center the actuator inside the valve housing, it is clamped between its top plate and its bottom plate by means of a spring sleeve, which is under a great deal of tensile stress, in such a way that the top plate and the bottom plate subject the actuator body to a corresponding initial compressive stress. In this instance, the spring sleeve absorbs the heat generated by the actuator body, dissipates it outward, and simultaneously provides for the centering of the actuator body in the valve housing required for the insulation.

According to the patent DE 197 15 488 C1 from Siemens AG, an actuator body is enclosed by a polymer casing which has an open air gap between itself and the inner wall of the valve housing. This produces the disadvantage that the heat dissipation to the valve housing is impeded by the air gap.

Object and Advantages of the Invention

In view of the above mentioned, the object of the invention is to produce a piezoelectric actuator of this generic type, which is protected against contamination and moisture even before installation in the valve housing, in which a simple centering of the actuator in the valve housing is achieved. Simultaneously, an electric insulation of the actuator to the valve housing and favorable heat transmission from the actuator to the valve housing are achieved.

According to an essential aspect of the invention, the actuator—at least including the top plate—is enclosed by an electrically insulating elastomer sleeve so that the actuator with the elastomer sleeve rests snugly against the inner wall of the axial bore of the valve housing in the vicinity of the actuator. Before insertion of the actuator into the axial bore, this elastomer sleeve preferably has a convex shape whose diameter exceeds the inner diameter of the axial bore of the housing over the entire axial length of the actuator body. As a result, the actuator is centered according to the invention over the entire length of the actuator body after insertion into the valve housing, is electrically insulated from the valve housing, and is protected against contamination and damage before installation. At the same time favorable heat transmission from the actuator body to the valve housing is assured. In the piezoelectric actuator according to the invention, at least the bottom plate is integrated with the actuator body by means of the elastomer sleeve and consequently, the elastomer sleeve adhering to the actuator body and to at least the bottom plate leads to a better centering during installation. The integration of the top and bottom plate also prevents a rotation of the actuator so long as at least the bottom plate is secured in the valve housing.

If the top and bottom plate are completely or partially made of electrically insulating material, then the short-circuit danger on the top and bottom of the actuator can be considerably reduced. Even with a metallic top and bottom plate, the encapsulation within the elastomer sleeve greatly improves the short-circuit safety.

Intentional air inclusions in the elastomer can, if necessary, be used to reduce compressive strains produced by thermal expansion.

If necessary, the centering of the actuator body can be improved by means of inserted centering rings made of a stronger polymer.

Since the elastomer sleeve also encompasses the mobile top plate, it is used there to center and guide the actuator without producing abrasion between the top plate and the valve housing.

The actuator which is encapsulated by the elastomer sleeve before installation can be more favorably and reliably transported and installed.

Optionally, the elastomer sleeve is filled with thermally conductive supplementary particles which increase the thermal conductivity of the elastomer sleeve and thereby improve the dissipation of the heat produced during operation of the actuator body.

Other ductile polymers can also be used in lieu of the elastomer sleeve.

The above-mentioned advantages and other advantageous features will be clarified in the following description of several exemplary embodiments of a piezoelectric actuator according to the invention when this description is read in conjunction with the drawings.

EXEMPLARY EMBODIMENTS

Figure 1:
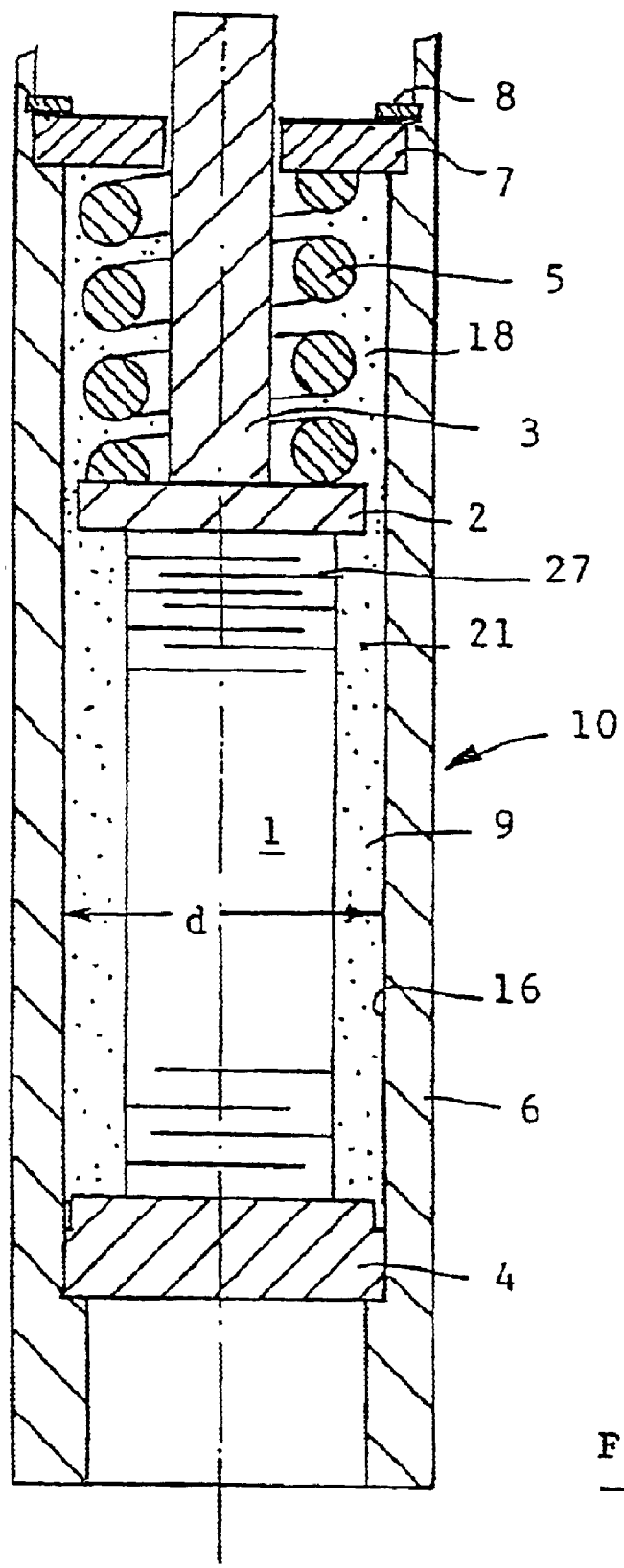
FIG. 1 is a schematic longitudinal section through a first exemplary embodiment of a piezoelectric actuator according to the invention, installed in a valve housing.

FIG. 1 is a schematic longitudinal section through a piezoelectric actuator which is labeled as a whole with the reference numeral 10 and which has a multilayered piezoelectric actuator body 1 in the form of a multilayered laminate (not shown) made up of stacked layers of piezoelectric material with intervening metallic or electrically conductive layers that function as electrodes 27. The end faces of the actuator body 1 are respectively contacted by a top plate 2 oriented toward the valve having an axially protruding valve tappet 3 and a bottom plate 4 at the opposite end affixed to a valve housing 6, and the actuator 10 is installed in an axial bore 16 of the steel valve housing 6. At its ends, the actuator 10 is prestressed, for example, by means of a helical spring 5, since the actuator 10 can only transmit compressive forces and must not be subjected to any tensile stress during dynamic operation. The frictional engagement of the initial stress is produced by means of the metallic valve housing 6 and the shoulder of a thrust washer 7, which is attached to the valve housing 6 by means of a securing ring 8 or a screw connection (not shown in FIG. 1).

The piezoelectric actuator 10, which is comprised of the actuator body 1, the bottom plate 4, and the top plate 2 with the axially protruding valve tappet 3, is supplemented by means of an electrically insulating elastomer sleeve 9, 18, which can be affixed even before installation of the actuator 10 so that the thus encapsulated actuator 10 can be more favorably and reliably transported and installed since the bottom plate 4 and the top plate 2 are integrated together with the actuator body 1 by means of the elastomer sleeve 9, 18.

FIG. 1 shows that it is possible to also integrate the compression spring 5 into the actuator unit 10 by means of an elastomer sleeve 18 provided above the top plate 2.

As clarified below in conjunction with the description of FIG. 2, the outer diameter D of the elastomer sleeve 9, 18 encompassing the actuator body 1 with the top plate 2, the bottom plate 4, and optionally also the compression spring 5, at least along the actuator body 1 before insertion of the piezoelectric actuator 10 into the axial bore 16, can be somewhat greater than the diameter d of the axial bore 16 of the valve housing 6 so that when the actuator 10 is installed as shown in FIG. 1, the elastomer sleeve 9, 18 is pressed snugly against the inner wall of the valve housing 6. This measure centers the thus embodied piezoelectric actuator 10 in the valve housing 6 without further centering means, electrically insulates it in relation to the valve housing 6, and also stays in favorable thermally conductive contact with the valve housing 6. In order to further improve the heat dissipation of the elastomer sleeve 9, 18 to the valve housing 6, the elastomer sleeve 9 is filled with thermally conductive supplemental particles 21.

The bottom plate 4 is secured in the valve housing 6. Since the bottom plate 4 is affixed in the valve housing 6, the integration of the bottom plate 4 and also the top plate 2 with the elastomer sleeve 9, 18 results in the fact that the entire actuator 10 is secured against rotation. The elastomer sleeve 9 disposed between the top plate 2 and the valve housing 6 is used to center and guide the top plate 2, which is moved during operation, inside the valve housing 6 without producing abrasion on the top plate 2 toward the housing 6.

Figure 2:
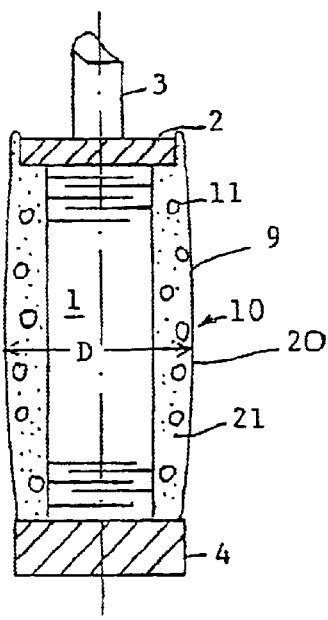
FIG. 2 is a schematic longitudinal section through a second exemplary embodiment of a piezoelectric actuator according to the invention, before being installed in a valve housing.

FIG. 2 shows a second exemplary embodiment of a piezoelectric actuator 10 according to the invention, before insertion into a valve housing. The elastomer sleeve 9 encompassing the actuator body 1 has an outer diameter D in the form of a convex outer contour 20 that slightly exceeds the inner diameter d of the axial bore 16 of the valve housing 6, which is not shown in FIG. 2. The convexity 20 in FIG. 2 can be embodied in various forms, for example in a barrel shape as shown in FIG. 2, in a cylindrical shape (see FIG. 5), or in a conical shape. Such a convex contour of the elastomer sleeve 9 can have a suitable shape for the manufacture, installation, and function, provided that its diameter D slightly exceeds the inner diameter d of the axial bore 16 in the valve housing 6 (D>d), at least in sections, i.e. in the vicinity of the actuator body 1.

Alternatively, the installation can also take place with an intermediary film made of elastomer on the outer contour of an internal, previously installed elastomer sleeve. The fresh elastomer film can then solidify, i.e. after installation, and as a result can lead to an even better contact with the wall of the axial bore 16 in the valve housing 6. Consequently, in contrast to what is shown in FIG. 2, the actuator 10 can be produced with a retracted inner elastomer sleeve, whose outer diameter is smaller than the inner diameter d of the bore, and the remaining air gap after installation can be filled with a fresh elastomer layer.

In contrast to the first exemplary embodiment of the piezoelectric actuator 10 shown in FIG. 1, in the second exemplary embodiment shown in FIG. 2, air bubbles 11 are enclosed in the elastomer 9, which improve the compressibility of the elastomer 9. As explained below in conjunction with the third exemplary embodiment shown in FIG. 3A, in lieu of the air bubbles 11, deliberate grooves 12 can be let into the elastomer sleeve 9. This facilitates installation of the actuator 10 and reduces the pressures of thermal expansion.

Figure 3A:
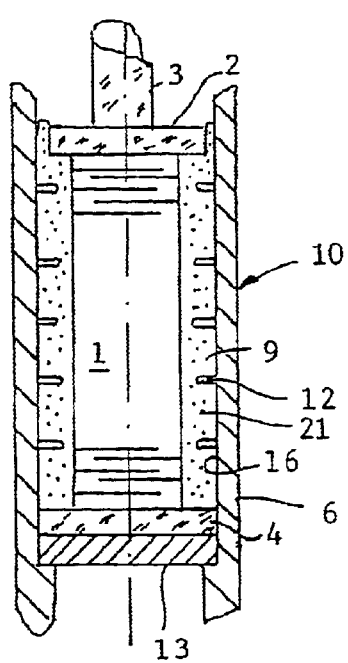
FIG. 3A is a schematic longitudinal section through a third exemplary embodiment of a piezoelectric actuator according to the invention, installed in a valve housing.
Figure 3B:
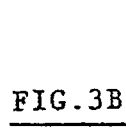
FIG. 3B is a sectional view of an alternative embodiment of a metallic bottom plate provided with a plasma sprayed layer.

In the third exemplary embodiment of a piezoelectric actuator 10 shown in FIG. 3A, the top plate 2, the valve tappet 3 that is of one piece with the top plate, and the bottom plate 4 are comprised of electrically insulating ceramic material. The bottom plate 4 is supported by a metal disk 13 for strength reasons, but can also be comprised entirely of ceramic. The actuator body 1 is electrically insulated fully by the ceramic plates 2, 4, the tappet 3, and the elastomer sleeve 9, which considerably increases its fail safety. In lieu of the bottom plate 4 comprised of ceramic material, according to FIG. 3B, a plasma sprayed layer 14 on a metallic bottom plate 4 can also be used, which likewise cooperates with the elastomer sleeve 9 to provide an electric insulation of the actuator 10. Although it is not shown in FIGS. 3A and 3B, a plasma sprayed layer of this kind can also be applied to the end face of a (metallic) top plate 2 oriented toward the actuator body 1 (see FIG. 5).

In the third exemplary embodiment according to FIG. 3A, the air inclusions 11 that were provided in the elastomer sleeve 9 in the second exemplary embodiment according to FIG. 2 are replaced by deliberately produced grooves 12, e.g. annular grooves, in the elastomer sleeve 9 in the vicinity of the actuator body 1.

Figure 4:
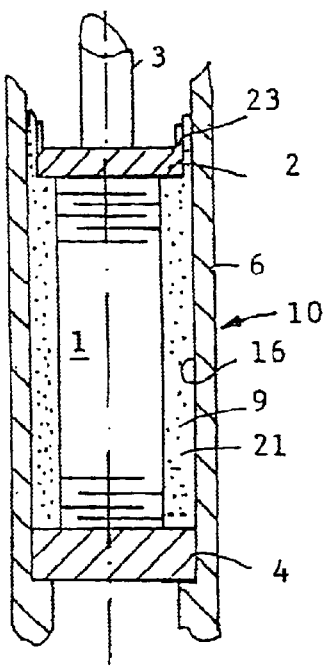
FIG. 4 is a schematic longitudinal section through a fourth exemplary embodiment of a piezoelectric actuator according to the invention, with an axially elongated top plate.

In the fourth exemplary embodiment of a piezoelectric actuator 10 according to the invention shown in FIG. 4, the lateral guidance of the top plate 2 that is moved with the actuator stroke is improved by means of an axial extension 23 of the top plate 2 which, as shown, is also enclosed by the elastomer sleeve 9.

Figure 5:
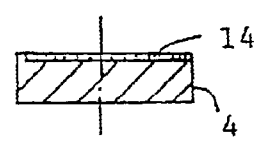
FIG. 5 is a schematic longitudinal section through a fifth exemplary embodiment of a piezoelectric actuator according to the invention that is provided with centering rings, before being installed in a valve housing.
Figure 5:
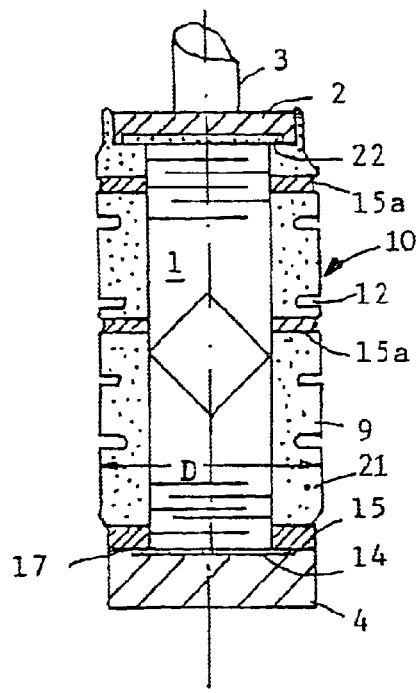

FIG. 5 shows a schematic longitudinal section through a fifth exemplary embodiment of a piezoelectric actuator 10 according to the invention, in which the metallic bottom plate 4 and the metallic top plate 2 are respectively insulated in relation to the piezoelectric actuator body 1 by means of an insulating plasma sprayed layer 14 and 22. An additional plastic centering ring 15 is glued onto the bottom plate 4 (glue layer 17) in order to center the actuator body 1 on the actuator 10 and to center the actuator 10 in the housing 6. The centering ring 15 is always shaped so that it fits around the actuator body 1 with positive engagement. The advantage lies in the fact that the bottom plate 4 can be inexpensively ground and the ring 15 can be easily glued to it. The centering ring 15 can be comprised of a stronger polymer.

Additional centering rings 15a made of stronger polymer can be affixed at several arbitrary points of the actuator body 1 in order to improve its centering and to reduce the danger of its bending, particularly when an actuator body 1 is used which is longer than its cross section. In addition, the centering rings 15a together with the elastomer sleeve 9 itself stabilize the actuator against lateral vibrations.

In contrast to the curved convex outer contour of the elastomer layer 9 used in the exemplary embodiment shown in FIG. 2, in the fifth exemplary embodiment shown in FIG. 5, the outer contour of the elastomer layer 9 is cylindrical so that its outer diameter D in the vicinity of the actuator body 1 constantly exceeds the inner diameter d of the bore 16 in the valve housing 6. The cross section of the actuator body 1 is shown as square by way of example in FIG. 5. In lieu of a square cross section, the actuator body 1 in all the exemplary embodiments can also have a rectangular, circular, oval, or other cross-sectional shape. Likewise, the bore 16 in the valve housing 6 can have not only a cylindrical contour but also a square, rectangular, or oval contour.

In particular, the invention provides the following advantages:

A. By means of the elastomer sleeve that is affixed before installation of the actuator, the actuator is protected against contamination and moisture and as a result is easier to store and install.

B. Integration of the top plate and the bottom plate with the actuator body results in an improved centering during installation.

C. A rotation of the actuator body is likewise prevented by means of the integration of the top plate and bottom plate with the actuator body, so long as at least the bottom plate is secured in the valve housing.

D. If the top plate and the bottom plate are entirely or partially made of electrically insulating plastic, the short-circuit danger on the top and bottom of the actuator is considerably improved, wherein the encapsulation with the elastomer sleeve according to the invention also considerably improves the short-circuit safety, even when the top and bottom plate are made of metal.

E. The air inclusions in the elastomer sleeve reduce compressive strains produced by thermal expansion. This is further improved if the air inclusions are replaced with deliberately produced grooves in the elastomer sleeve.

F. The centering of the actuator body can, if necessary, be improved by means of the inserted centering rings made of a stronger polymer.

G. On the mobile top plate of the actuator, the elastomer sleeve can also center and guide this top plate in relation to the stationary metallic valve housing, without producing an abrasion on the top plate toward the housing.

H. The encapsulated actuator unit can be more favorably and reliably transported and installed than a non-encapsulated actuator.

I. By introducing thermally conductive supplementary particles into the elastomer sleeve, the thermal conductivity of the elastomer sleeve and thereby the cooling of the actuator can be improved.

A multilayered piezoelectric actuator according to the invention can advantageously be used for diesel or gasoline injection devices or valves.

The foregoing relates to preferred exemplary embodiments of the invention, it being understood that other variants and embodiments thereof are possible within the spirit and scope of the invention, the latter being defined by the appended claims.

What is claimed is:

1. A piezoelectric actuator for actuating valves, having an actuator body (1) in the form of a multilayered laminate made up of stacked layers of piezoelectric material with intervening electrically conductive layers (27) that function as electrodes, and the end faces of this actuator body (1) are respectively contacted by a top plate (2) oriented toward the valve having an axially protruding valve tappet (3) and a bottom plate (4) at the opposite end, wherein the actuator (10) rests in an axial bore (16) of a valve housing (6), and is prestressed at the ends in the axial direction between the top plate (2) and the bottom plate (4) by means of a spring element (5), wherein at least part of the actuator (10) is enclosed by an electrically insulating sleeve (9, 19; 18) made of a ductile, polymer material so that when installed, the actuator (10) with the insulating sleeve (9, 19; 18) rests snugly against the inner wall of the axial bore (16) of the valve housing (6) in the vicinity of the actuator (10), wherein the sleeve (9) includes air bubbles (11).

2. A piezoelectric actuator for actuating valves, having an actuator body (1) in the form of a multilayered laminate made up of stacked layers of piezoelectric material with intervening electrically conductive layers (27) that function as electrodes, and the end faces of this actuator body (1) are respectively contacted by a top plate (2) oriented toward the valve having an axially protruding valve tappet (3) and a bottom plate (4) at the opposite end, wherein the actuator (10) rests in an axial bore (16) of a valve housing (6), and is prestressed at the ends in the axial direction between the top plate (2) and the bottom plate (4) by means of a spring element (5), wherein at least part of the actuator (10) is enclosed by an electrically insulating sleeve (9, 19; 18) made of a ductile, polymer material so that when installed, the actuator (10) with the insulating sleeve (9, 19; 18) rests snugly against the inner wall of the axial bore (16) of the valve housing (6) in the vicinity of the actuator (10), wherein before insertion into the axial bore (16), the sleeve (9, 19) has a convexity (20) whose diameter (D), at least in sections, is greater than the inner diameter (d) of the axial bore (16) of the valve housing (6), and wherein the sleeve (9) includes air bubbles (11).

3. A piezoelectric actuator for actuating valves, having an actuator body (1) in the form of a multilayered laminate made up of stacked layers of piezoelectric material with intervening electrically conductive layers (27) that function as electrodes, and the end faces of this actuator body (1) are respectively contacted by a top plate (2) oriented toward the valve having an axially protruding valve tappet (3) and a bottom plate (4) at the opposite end, wherein the actuator (10) rests in an axial bore (16) of a valve housing (6), and is prestressed at the ends in the axial direction between the top plate (2) and the bottom plate (4) by means of a spring element (5), wherein at least part of the actuator (10) is enclosed by an electrically insulating sleeve (9, 19; 18) made of a ductile, polymer material so that when installed, the actuator (10) with the insulating sleeve (9, 19; 18) rests snugly against the inner wall of the axial bore (16) of the valve housing (6) in the vicinity of the actuator (10), wherein the outer contour of the sleeve (9) has grooves (12) at definite locations.

4. The piezoelectric actuator according to claim 3, wherein the grooves (12) are embodied as annular grooves.

5. A piezoelectric actuator for actuating valves, having an actuator body (1) in the form of a multilayered laminate made up of stacked layers of piezoelectric material with intervening electrically conductive layers (27) that function as electrodes, and the end faces of this actuator body (1) are respectively contacted by a top plate (2) oriented toward the valve having an axially protruding valve tappet (3) and a bottom plate (4) at the opposite end, wherein the actuator (10) rests in an axial bore (16) of a valve housing (6), and is prestressed at the ends in the axial direction between the top plate (2) and the bottom plate (4) by means of a spring element (5), wherein at least part of the actuator (10) is enclosed by an electrically insulating sleeve (9, 19; 18) made of a ductile, polymer material so that when installed, the actuator (10) with the insulating sleeve (9, 19; 18) rests snugly against the inner wall of the axial bore (16) of the valve housing (6) in the vicinity of the actuator (10), wherein before insertion into the axial bore (16), the sleeve (9, 19) has a convexity (20) whose diameter (D), at least in sections, is greater than the inner diameter (d) of the axial bore (16) of the valve housing (6), and wherein the outer contour of the sleeve (9) has grooves (12) at definite locations.

6. The piezoelectric actuator according to claim 5, wherein the grooves (12) are embodied as annular grooves.

7. A piezoelectric actuator for actuating valves, having an actuator body (1) in the form of a multilayered laminate made up of stacked layers of piezoelectric material with intervening electrically conductive layers (27) that function as electrodes, and the end faces of this actuator body (1) are respectively contacted by a top plate (2) oriented toward the valve having an axially protruding valve tappet (3) and a bottom plate (4) at the opposite end, wherein the actuator (10) rests in an axial bore (16) of a valve housing (6), and is prestressed at the ends in the axial direction between the top plate (2) and the bottom plate (4) by means of a spring element (5), wherein at least part of the actuator (10) is enclosed by an electrically insulating sleeve (9, 19; 18) made of a ductile, polymer material so that when installed, the actuator (10) with the insulating sleeve (9, 19; 18) rests snugly against the inner wall of the axial bore (16) of the valve housing (6) in the vicinity of the actuator (10), wherein at least one radial centering ring (15, 15a), made of a material which is stronger than the rest of the sleeve, encompasses the actuator body (1), wherein the inner contour of the centering ring (15, 15a) is adapted to the outer contour of the actuator body (1) and the outer contour of the centering ring (15, 15a) is adapted to the inner contour of the axial bore (16) of the valve housing (6).

8. A piezoelectric actuator for actuating valves, having an actuator body (1) in the form of a multilayered laminate made up of stacked layers of piezoelectric material with intervening electrically conductive layers (27) that function as electrodes, and the end faces of this actuator body (1) are respectively contacted by a top plate (2) oriented toward the valve having an axially protruding valve tappet (3) and a bottom plate (4) at the opposite end, wherein the actuator (10) rests in an axial bore (16) of a valve housing (6), and is prestressed at the ends in the axial direction between the top plate (2) and the bottom plate (4) by means of a spring element (5), wherein at least part of the actuator (10) is enclosed by an electrically insulating sleeve (9, 19; 18) made of a ductile, polymer material so that when installed, the actuator (10) with the insulating sleeve (9, 19; 18) rests snugly against the inner wall of the axial bore (16) of the valve housing (6) in the vicinity of the actuator (10), wherein before insertion into the axial bore (16), the sleeve (9, 19) has a convexity (20) whose diameter (D), at least in sections, is greater than the inner diameter (d) of the axial bore (16) of the valve housing (6), and wherein at least one radial centering ring (15, 15a), made of a material which is stronger than the rest of the sleeve, encompasses the actuator body (1), wherein the inner contour of the centering ring (15, 15a) is adapted to the outer contour of the actuator body (1) and the outer contour of the centering ring (15, 15a) is adapted to the inner contour of the axial bore (16) of the valve housing (6).

* * * * *